United States Patent
Kim et al.

(10) Patent No.: US 8,404,588 B2
(45) Date of Patent: Mar. 26, 2013

(54) METHOD OF MANUFACTURING VIA ELECTRODE

(75) Inventors: Dong-Pyo Kim, Daejeon (KR); Kyu-Ha Baek, Daejeon (KR); Kunsik Park, Daejeon (KR); Ji Man Park, Daejeon (KR); Zin Sig Kim, Daejeon (KR); Joo Yeon Kim, Daejeon (KR); Ye Sul Jeong, Pohang-si (KR); Lee-Mi Do, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/267,215

(22) Filed: Oct. 6, 2011

(65) Prior Publication Data
US 2012/0086132 A1     Apr. 12, 2012

(30) Foreign Application Priority Data

Oct. 6, 2010 (KR) .......... 10-2010-0097300
Feb. 9, 2011 (KR) .......... 10-2011-0011565

(51) Int. Cl.
*H01L 21/44* (2006.01)
(52) U.S. Cl. .......... 438/675; 438/672; 257/E21.585

(58) Field of Classification Search .......... 438/641; 257/E21.532, E21.536
See application file for complete search history.

(56) References Cited

U.S. PATENT DOCUMENTS

| 7,670,950 B2 | 3/2010 | Richardson et al. |
| 2011/0006425 A1* | 1/2011 | Wada et al. .......... 257/750 |

OTHER PUBLICATIONS

Manabu Bonkohara et al., "Current and Future Three-Dimensional LSI Integration Technology by "Chip on Chip", "Chip on Wafer" and "Wafer on Wafer"", Mater. Res. Soc. Symp. Proc., 2007, vol. 970, Materials Research Society.
Jong-Woong Kim et al., "Fabrication and electrical characterization of through-Si-via interconnect for 3-D packaging", MEMS MOEMS, Jan.-Mar. 2009, pp. 013040-1-013040-8, vol. 8(1), SPIE.

* cited by examiner

*Primary Examiner* — Cheung Lee

(57) ABSTRACT

Provided is a method of manufacturing a via electrode by which productivity and production yield can be augmented or maximized. The method of the present invention includes: forming a via hole at a substrate; forming a catalyst layer at a sidewall and a bottom of the via hole; and forming a graphene layer in the via hole by exposing the catalyst layer to a solution mixed with graphene particles.

14 Claims, 7 Drawing Sheets

METHOD OF MANUFACTURING VIA ELECTRODE

CROSS-REFERENCE TO RELATED APPLICATIONS

This U.S. non-provisional patent application claims priority under 35 U.S.C. §119 of Korean Patent Application Nos. 10-2010-0097300, filed on Oct. 6, 2010, and 10-2011-0011565, filed on Feb. 9, 2011, the entire contents of which are hereby incorporated by reference.

BACKGROUND OF THE INVENTION

The present invention disclosed herein relates to a method of manufacturing a via electrode, and more particularly, to a method of manufacturing a via electrode containing graphene particles.

Recently, portable electronics tend to become smaller, lighter and more multi-functional. Typical portable electronics adopt uniform high-performance electronic components and stable systems. In particular, stacked chip packages in which a plurality of semiconductor chips including integrated multiple transistors are mounted in multiple layers are increasingly used as semiconductor components for production cost reduction. Typical stacked chip packages can reduce resistance between wires connecting substrates by means of through silicon vias (TSVs).

A TSV may contain metallic materials formed by such methods as electroplating, laser reflowing, dipping, and paste printing. As an example, laser reflowing or dipping is carried out at a high pressure of over about 5 Mpa and paste printing requires a high heat treatment temperature, which tends to result in a lower profitability.

SUMMARY OF THE INVENTION

The present invention provides a method of manufacturing a via electrode which contains a material more conductive than a metal.

The present invention also provides a method of manufacturing a via electrode which may be produced at a reduced production cost and augment or maximize productivity.

The present invention also provides a method of manufacturing a via electrode which may augment or maximize production yield by preventing a void defect or a seam defect of a via hole.

Embodiments of the inventive concepts provide methods for manufacturing a via electrode, including forming a via hole at a substrate; forming a catalyst layer at a sidewall and a bottom of the via hole; and forming a graphene layer in the via hole by exposing the catalyst layer to a solution mixed with graphene particles.

In some embodiments, the formation of the graphene layer may include immersing the substrate in a solvent, and forming the graphene layer on the catalyst layer by supplying the solution into the solvent.

In other embodiments, the methods may include removing an air bubble in the via hole by making external pressure of the solvent lower than atmospheric pressure after the substrate is immersed in the solvent.

In still other embodiments, the graphene particles may contain at least one of graphene flakes, graphene powder, magnetic graphene nanoparticles, and graphene-coated metal particles.

In even other embodiments, the formation of the graphene layer may include applying a magnetic field to a lower portion of the substrate.

In yet other embodiments, the solvent may contain deionized water, alcohol, or iodic acid.

In further embodiments, the formation of the graphene layer may further include removing the graphene layer evenly so that an upper surface of the substrate is exposed after the substrate is discharged out of the solvent, and hardening the graphene layer through a heat treatment process.

In still further embodiments, the methods may further include forming a wiring layer on the graphene layer.

In even further embodiments, the methods may further include forming an insulation film between the catalyst layer and the via hole.

In other embodiments of the inventive concepts, via electrodes include: a substrate; a via hole formed on the substrate; a catalyst layer formed at a bottom and a sidewall of the via hole; and a graphene layer formed in the via hole, the graphene layer having a lower position than an upper surface of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concepts and, together with the description, serve to explain principles of the present invention. In the drawings.

DETAILED DESCRIPTION OF PREFERRED EMBODIMENTS

Figure 1:
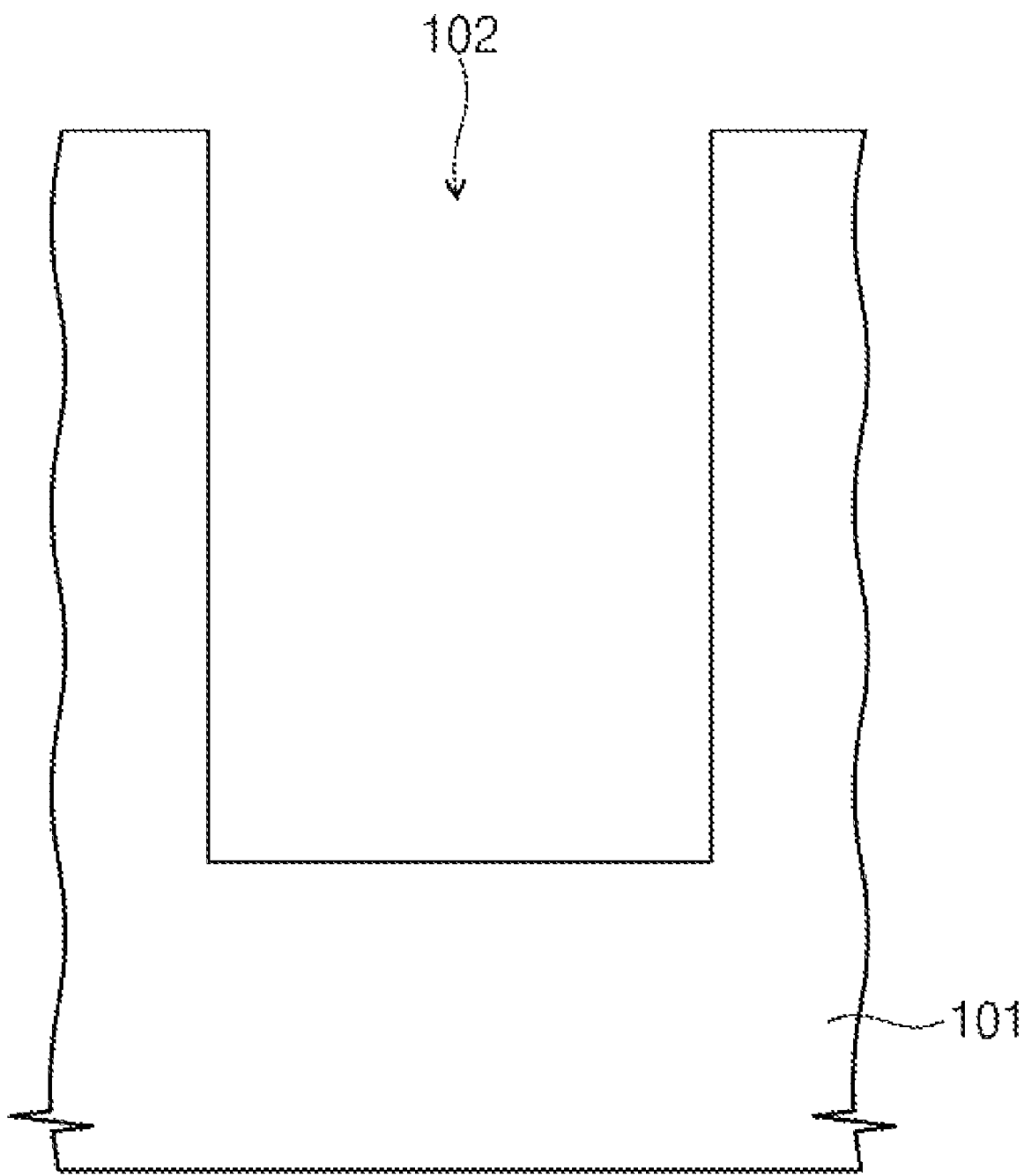
FIGS. 1 through 7 are sectional views illustrating processes of manufacturing a via electrode according to embodiments of the inventive concepts.

Preferred embodiments of the inventive concepts will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

FIGS. 1 through 7 are sectional views illustrating processes of manufacturing a via electrode according to embodiments of the inventive concepts.

Referring to FIG. 1, a via hole 102 is formed at a substrate 101. The substrate 101 may include a silicon substrate, a silicon-on-insulator (SOI) substrate, or a compound semiconductor substrate. The substrate 101 may include substrates formed of other materials. An upper portion of the substrate 101 may include an active area where a semiconductor device such as a transistor is formed. The via hole may be formed through a photolithographic process. The photolithographic process may include patterning of a photo mask film (not illustrated), and an etching process to remove the substrate 101 exposed from the photo mask film. The patterning of the photo mask film may include a photo resist application process, an exposure process, a development process, and a baking process. The etching process may include a dry etching method such as deep reactive ion etching (DRIE). Etching reaction gases such as sulfur hexafluoride ($SF_6$) and sulfur hexafluoride-oxygen ($SF_6O_2$) and polymer formation gases such as trifluoromethane ($CHF_3$) and octafluorocyclobutane ($C_4F_8$) may be used repeatedly for DRIE.

Figure 2:
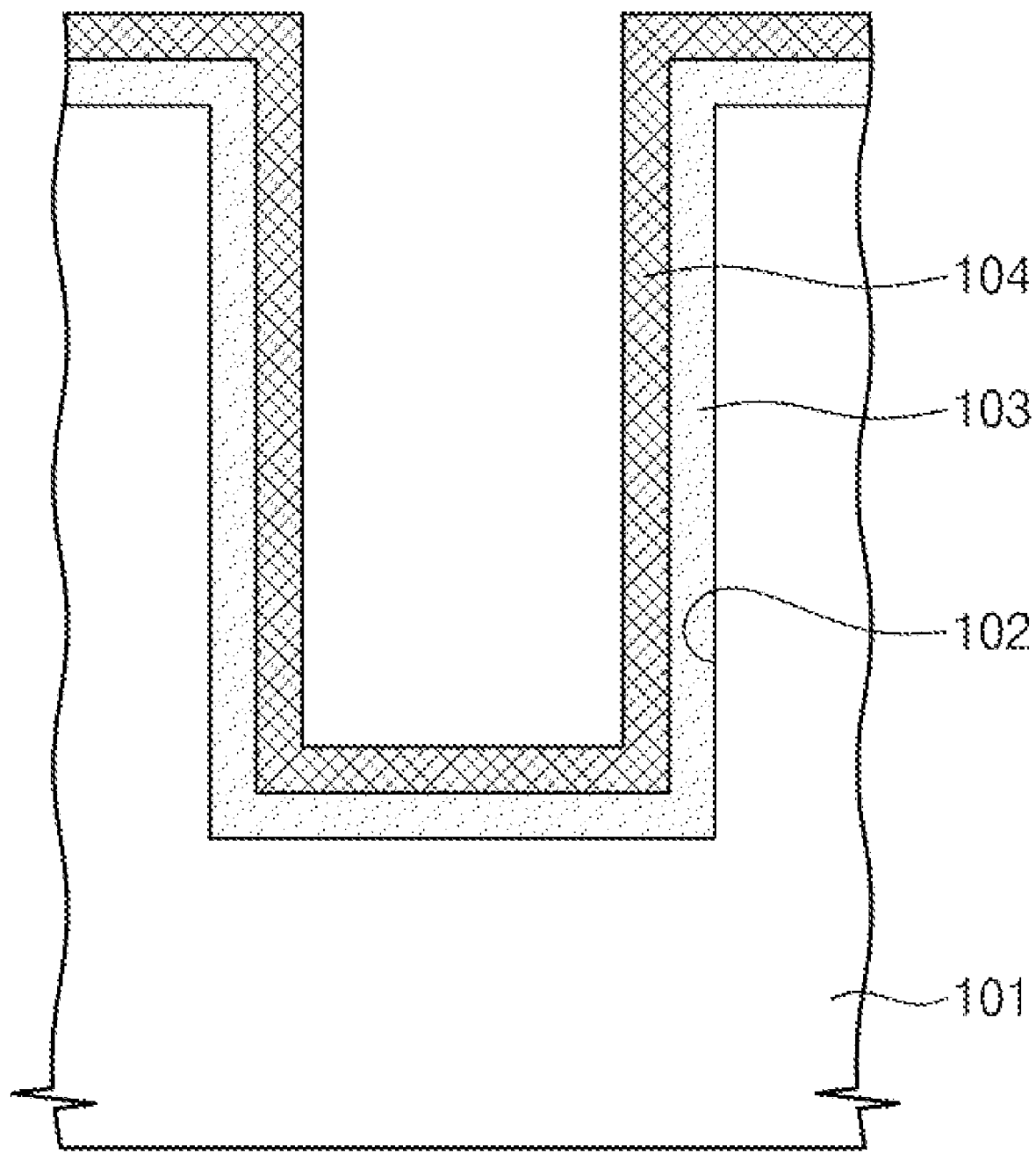

Referring to FIG. 2, an insulation film 103 and a catalyst layer 104 are formed at a sidewall and a bottom of the via hole 102. The insulation film 103 may contain a tetraethylorthosilicate (TEOS) silicon oxide film formed by sub-atmospheric pressure chemical vapor deposition (SAPCVD). The catalyst layer may contain such metals as titanium, tantalum, and nickel. The catalyst layer may be a barrier layer configured to prevent an oxidation reaction by oxygen in the insulation film 103. The catalyst layer 104 may gain high adhesive strength from the insulation film 103. The catalyst layer 104 may be formed by chemical vapor deposition (CVD) or atomic layer deposition (ALD). Though not illustrated, a polymer layer may be formed on the catalyst layer 104. The polymer layer may contain a dummy graphene layer formed by CVD or physical vapor deposition (PVD). As an example, the polymer layer may be from about 30 Å to about 500 Å in thickness.

Figure 3:
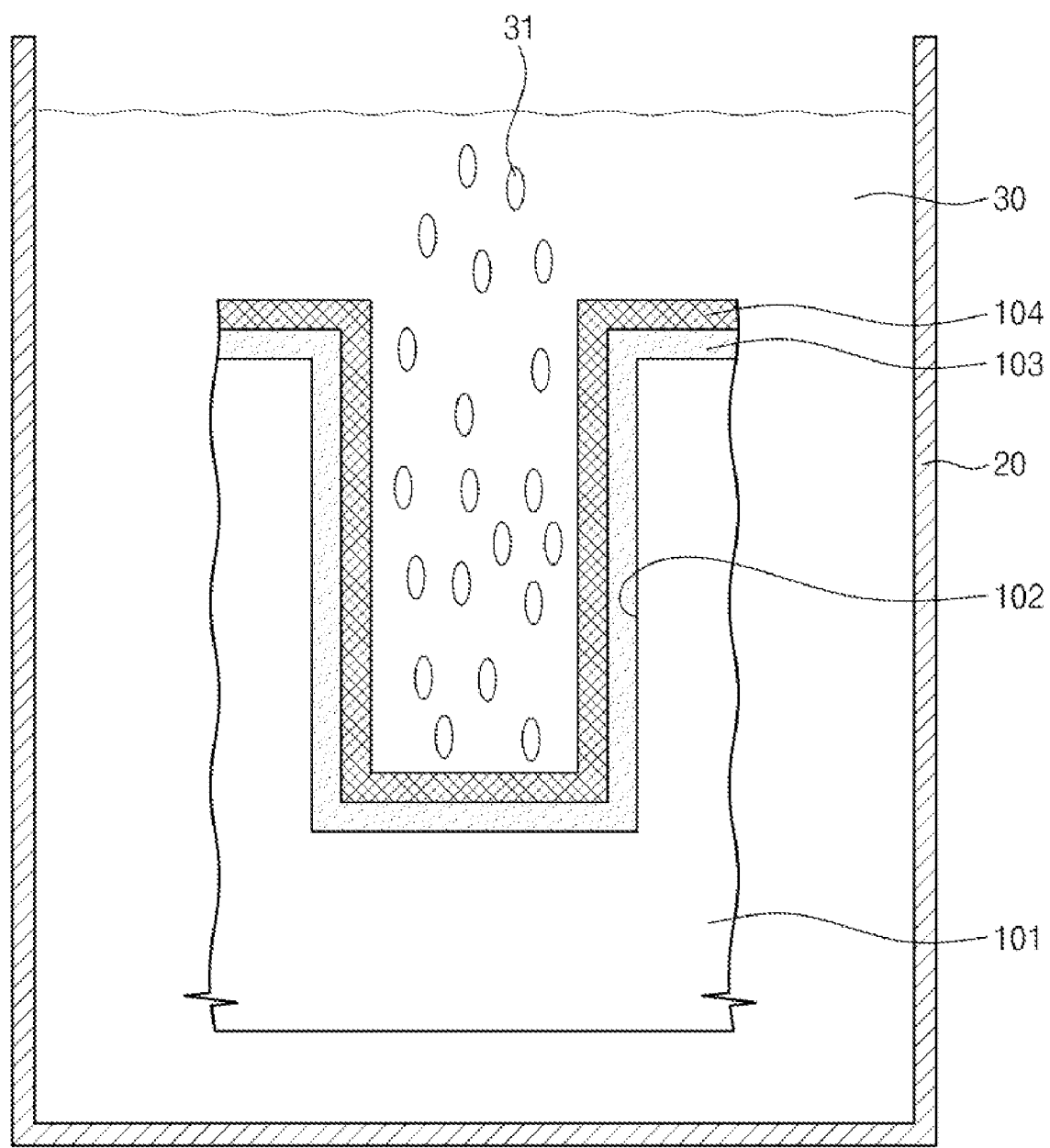

Referring to FIG. 3, the substrate 101 is immersed in a chemical tank 20 filled with a solvent 30. The solvent 30 may contain at least one of deionized water, alcohol, or iodic acid. An air bubble 31 in the via hole 102 can be removed by reducing external pressure of the solvent 30. The external pressure of the solvent 30 may be lower than atmospheric pressure of 760 Torr. The solvent may be supplied after the substrate 101 is received by the chemical tank 20.

Figure 4:
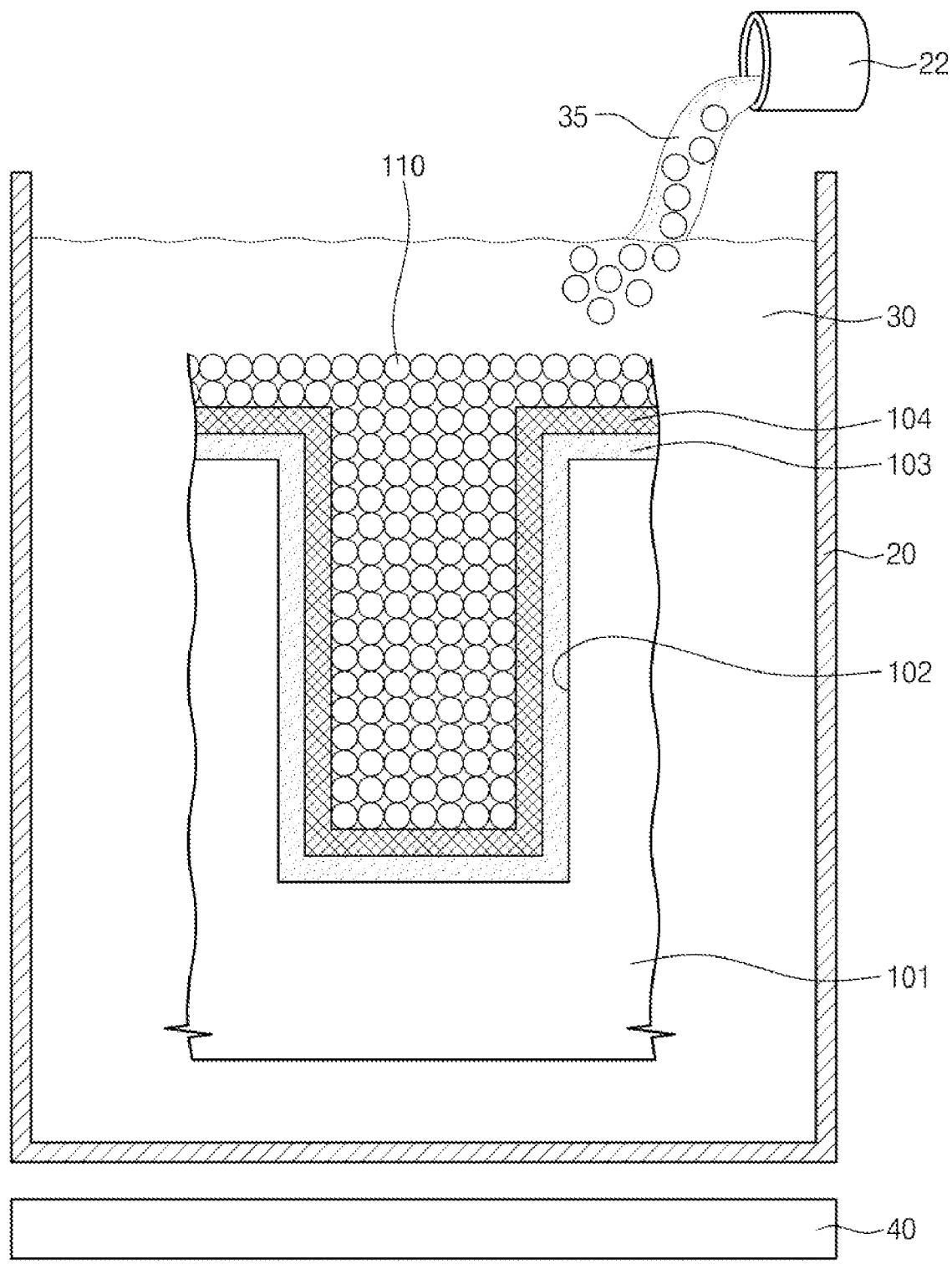

Referring to FIG. 4, a first graphene layer 110 is formed on the catalyst layer 104 by supplying the solvent 30 with graphene particles. The graphene particles may be dissolved by a solution 35 and then supplied to the solvent 30. The solution 35 containing the graphene particles may be supplied into the chemical tank 20 from a container 22. Electrical conductivity of the graphene particles can be over about 10 times electrical conductivity of a metal. The graphene particles may be from about dozens of nanometers to about hundreds of nanometers in size. The graphene particles may contain graphene flakes and graphene powder. Also, the graphene particles may contain metal particles coated with graphene flakes or graphene powder. The graphene particles may be magnetic. The graphene particles may settle freely in the solvent 30 by gravity, or the graphene particles may be deposited on the substrate 101 disposed in the solvent 30 by a magnetic field applied from a lower portion of the chemical tank 20. The magnetic field may be applied by a magnet 40 disposed in the lower portion of the chemical tank 20. The first graphene layer 110 may contain graphene particles formed at an upper portion of the catalyst layer 104. The first graphene layer 110 may be buried gradually from the bottom of the via hole 102 to an upper portion of the via hole 102.

In the aforementioned manner, the method of manufacturing a via electrode according to embodiments of the inventive concepts can prevent a void defect and a seam defect of the first graphene layer 110, and can augment or maximize production yield.

Figure 5:
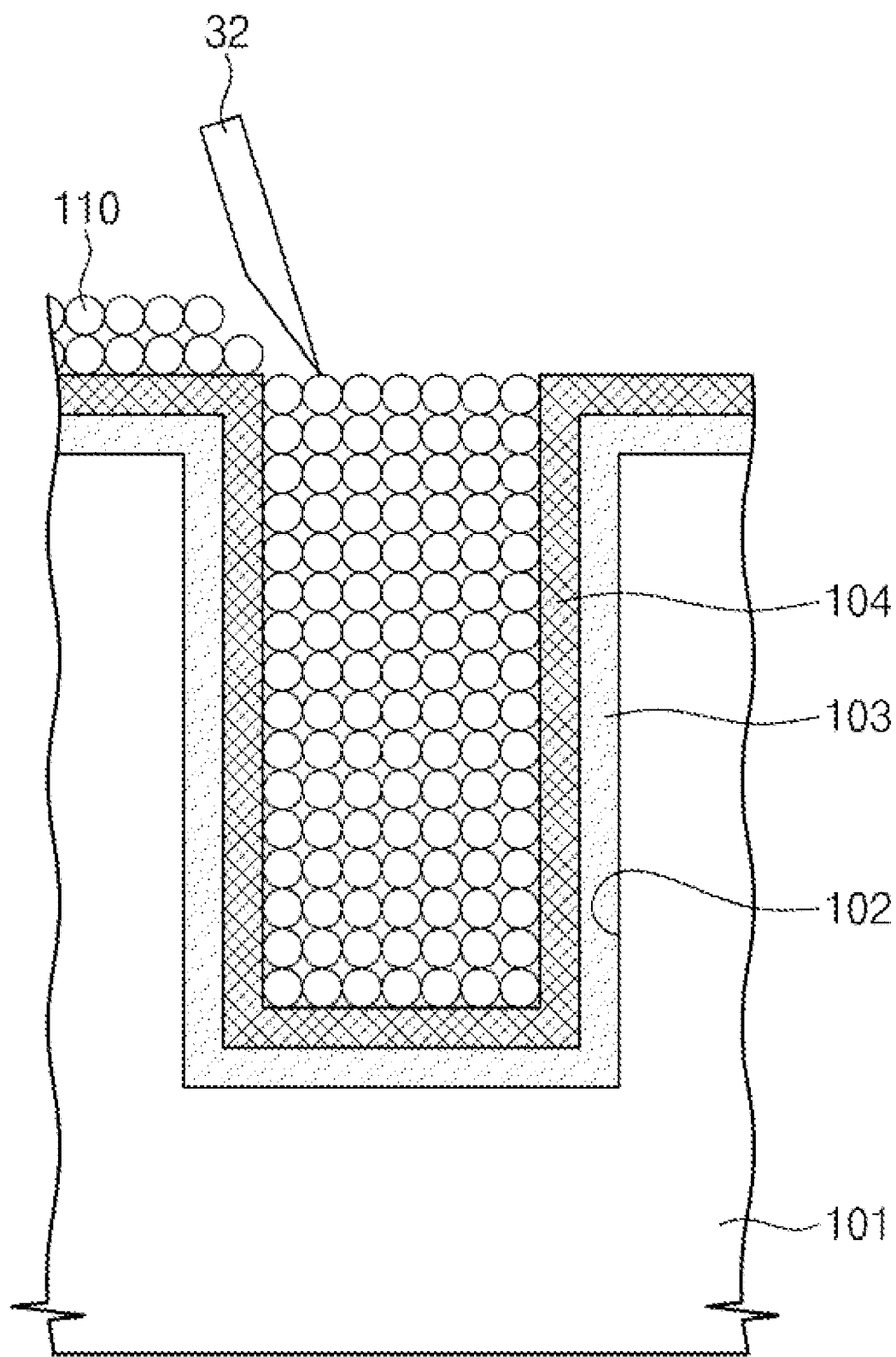

Referring to FIG. 5, the first graphene layer is planarized after the substrate 101 is separated from the solvent 30 in the chemical tank 20 so that the catalyst layer 104 formed on an upper surface of the substrate 101 is exposed. The first graphene layer 110 may be planarized by sweeping of a squeezer 32. The substrate 101 and the first graphene layer 110 may be dried.

Figure 6:
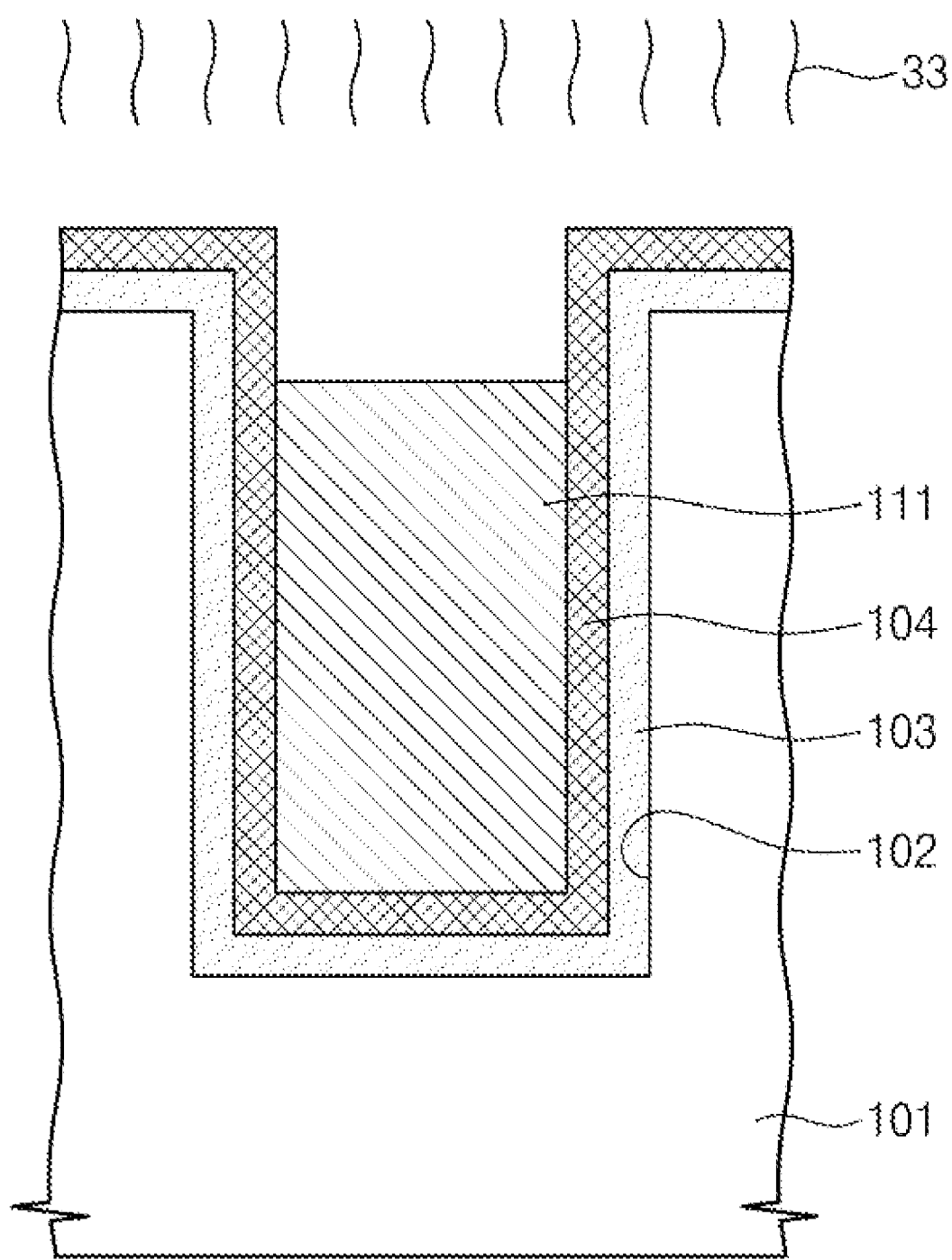

Referring to FIG. 6, a second graphene layer 111 may be formed by hardening the first graphene layer 110 through a first heat treatment process 33. The second graphene layer 111 may have a higher density than the first graphene layer 110. The first heat treatment process 33 may be carried out at between about 80° C. and about 120° C., which is higher than a boiling point of the solvent 30. Through the first heat treatment process 33, the solvent 30 and the solution 35 left in the first graphene layer 110 in the via hole 102 may be removed, and the second graphene layer 111 which has less volume than the first graphene layer 110 may be formed. The second graphene layer 111 may have a lower position than the first graphene layer 110 in the via hole 102. Through the first heat treatment process 33, the second graphene layer 111 which is denser than the first graphene layer 110 may be formed. In the aforementioned manner, the method of manufacturing a via electrode according to embodiments of the inventive concepts can augment or maximize productivity and production yield.

Figure 7:
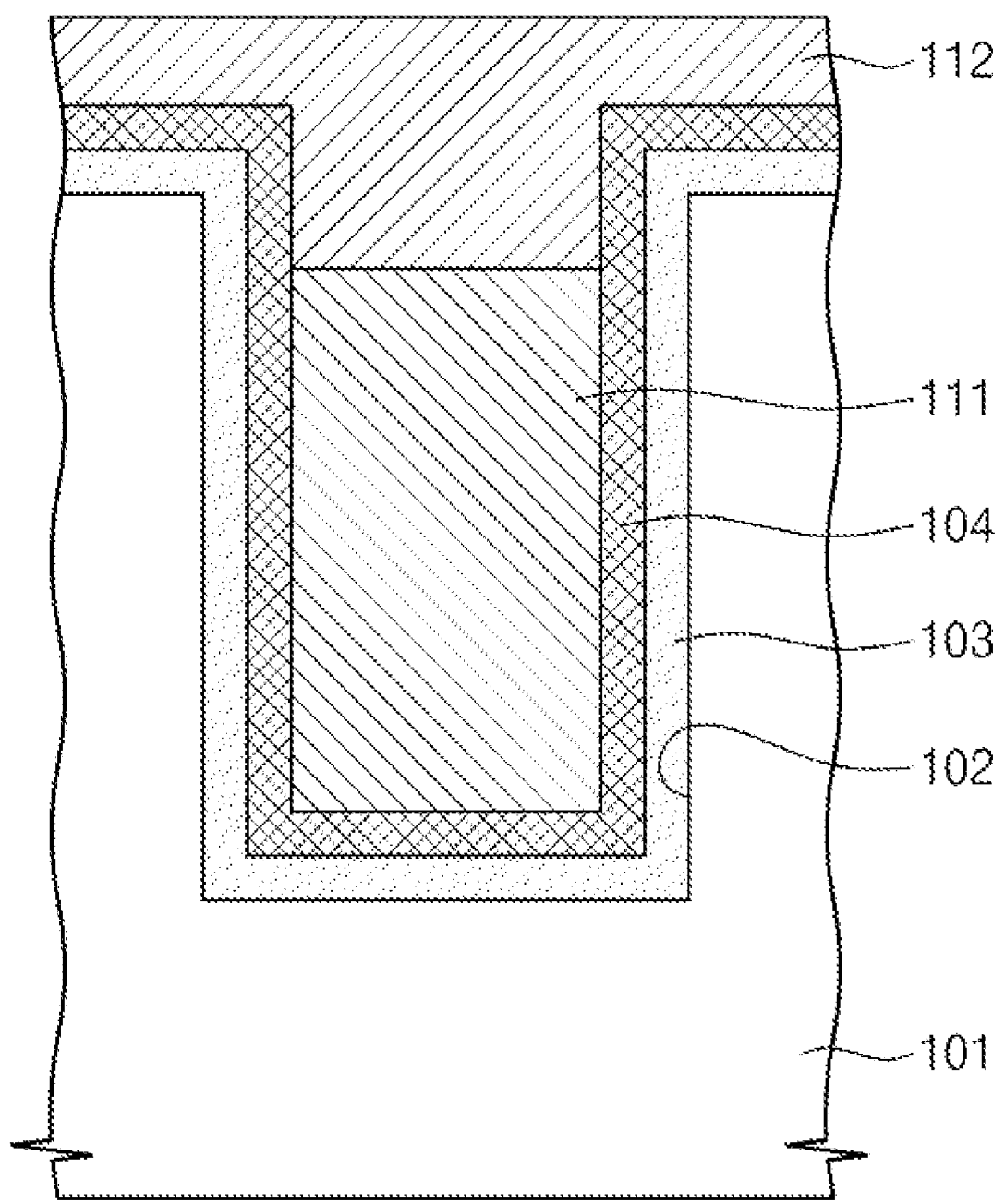

Referring to FIG. 7, a wiring layer 112 is formed on the second graphene layer 111. The wiring layer 112 may contain polysilicon doped with a conductive impurity or a metal such as gold, silver, tungsten, copper, aluminum, cobalt, nickel and molybdenum. The wiring layer 112 may be formed through a metal deposition process and a photolithographic process. The wiring layer 112 may contain a carbon nanotube or graphene paste. The wiring layer 112 may be formed through a printing process.

Although not illustrated, a recess may be formed at the wiring layer 112 disposed on an upper portion of the second graphene layer 111 by heating the substrate 101. The recess may be formed through a second heat treatment process. Then, a TSV may be formed by planarizing a rear surface of the substrate 101 so that the second graphene layer 111 is exposed.

As described above, the method of manufacturing a via electrode according to embodiments of the inventive concepts can augment or maximize electrical characteristics because of the graphene layer more conductive than a metal. In addition, productivity can be augmented or maximized because the graphene layer can be formed with ease by dissolving the graphene particles in the via hole of the substrate settled in the solvent. Also, production yield can be augmented or maximized because a void defect or a seam defect of the graphene layer in the via hole can be prevented.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A method of manufacturing a via electrode, comprising:
   forming a via hole in a substrate;

forming a catalyst layer over a sidewall and a bottom of the via hole; and forming a graphene layer in the via hole by exposing the catalyst layer to a solution mixed with graphene particles.

2. The method of claim 1, wherein the formation of the graphene layer comprises:

immersing the substrate in a solvent; and forming the graphene layer on the catalyst layer by supplying the solution into the solvent.

3. The method of claim 2, further comprising removing an air bubble in the via hole by making external pressure of the solvent lower than atmospheric pressure after the substrate is immersed in the solvent.

4. The method of claim 2, wherein the graphene particles comprise at least one of graphene flakes, graphene powder, magnetic graphene nanoparticles, and graphene-coated metal particles.

5. The method of claim 4, wherein the formation of the graphene layer comprises applying a magnetic field to a lower portion of the substrate.

6. The method of claim 2, wherein the solvent comprises deionized water, alcohol, or iodic acid.

7. The method of claim 2, where the formation of the graphene layer further comprises:

removing the graphene layer evenly so that an upper surface of the substrate is exposed after the substrate is discharged out of the solvent; and hardening the graphene layer through a heat treatment process.

8. The method of claim 7, further comprising forming a wiring layer on the graphene layer.

9. The method of claim 1, further comprising forming an insulation film between the catalyst layer and the via hole.

10. A via electrode, comprising:

a semiconductor substrate;

a via hole provided in the semiconductor substrate;

a catalyst layer disposed over a bottom and a sidewall of the via hole; and a graphene layer disposed on the catalyst layer, wherein an upper surface of the graphene layer is lower than an upper surface of the semiconductor substrate.

11. The via electrode of claim 10, further comprising an insulation film disposed between the catalyst layer and the bottom and the sidewall of the via hole.

12. The via electrode of claim 10, further comprising a wiring layer disposed over the graphene layer.

13. The via electrode of claim 10, wherein the graphene layer comprises at least one of graphene flakes, graphene powder, magnetic graphene nanoparticles, and graphene-coated metal particles.

14. A via electrode, comprising:

a semiconductor substrate;

a via hole provided in the semiconductor substrate;

an insulation layer coated over a bottom surface and sidewalls of the via hole;

a catalyst layer coated over the bottom surface and the sidewalls of the via hole and disposed over the insulation layer;

a graphene layer filling in a portion of the via hole and disposed over the catalyst layer; and a wiring layer disposed in an upper portion of the via hole and over the graphene layer, wherein an upper surface of the graphene layer is lower than an upper surface of the semiconductor substrate.

* * * * *